(12) United States Patent
Zhang et al.

(10) Patent No.: US 9,621,138 B1
(45) Date of Patent: Apr. 11, 2017

(54) SLEW CONTROL USING A SWITCHED CAPACITOR CIRCUIT

(71) Applicant: NXP B.V., Eindhoven (NL)

(72) Inventors: Xu Zhang, Chandler, AZ (US); Siamak Delshadpour, Phoenix, AZ (US); Ahmad Yazdi, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/933,442

(22) Filed: Nov. 5, 2015

(51) Int. Cl.
| | |
|---|---|
| H03K 5/12 | (2006.01) |
| H03K 5/01 | (2006.01) |
| H03K 19/0185 | (2006.01) |
| H03K 3/353 | (2006.01) |

(52) U.S. Cl.
CPC .............. *H03K 5/01* (2013.01); *H03K 3/353* (2013.01); *H03K 19/018507* (2013.01)

(58) Field of Classification Search
CPC .................................. H03K 5/12; H03K 5/01
USPC ........ 327/170, 172–175, 108–112, 427, 434, 327/437; 326/82, 83, 87
See application file for complete search history.

(56) References Cited

U.S. PATENT DOCUMENTS

| | | | |
|---|---|---|---|
| 5,194,760 A | 3/1993 | Braun et al. | |
| 5,939,870 A | 8/1999 | Nguyen et al. | |
| 5,986,489 A | 11/1999 | Raza et al. | |
| 6,894,547 B2* | 5/2005 | Takahashi | H03K 19/018585 326/87 |
| 7,132,868 B2* | 11/2006 | Sakata | H02M 1/08 327/170 |
| 7,839,200 B2* | 11/2010 | Im | G11C 7/04 327/170 |
| 7,956,655 B1* | 6/2011 | Chiu | G11C 7/1057 326/33 |
| 8,981,817 B2* | 3/2015 | Kumar | H03K 19/00384 326/87 |
| 2006/0044034 A1* | 3/2006 | Jiang | H03K 4/94 327/170 |
| 2007/0057711 A1* | 3/2007 | Suzuki | H03K 19/00346 327/170 |
| 2013/0162304 A1* | 6/2013 | Kim | G09G 3/3659 327/109 |
| 2014/0312949 A1* | 10/2014 | Ahn | H03K 5/12 327/170 |
| 2015/0035574 A1* | 2/2015 | Cho | H03K 5/04 327/170 |
| 2015/0188533 A1* | 7/2015 | Viswanath | H03K 17/063 378/9 |

* cited by examiner

*Primary Examiner* — Lincoln Donovan
*Assistant Examiner* — Thomas Skibinski

(57) ABSTRACT

An apparatus includes a swing control circuit, a slew control circuit, and a driver circuit. The swing control circuit is configured and arranged to be powered by an input supply voltage, to receive an input data signal and, in response, to generate a first internal signal having a swing level corresponding to the input supply voltage. The slew control circuit, including a switched capacitor circuit, is configured and arranged to receive the first internal signal and, in response, to generate a second internal signal using the switched capacitor circuit that is configured to set a slew rate for the second internal signal. Further, the driver circuit is configured and arranged to receive the second internal signal and, in response, to generate an output signal that is based upon the swing level and the slew rate of the second internal signal.

20 Claims, 4 Drawing Sheets

SLEW CONTROL USING A SWITCHED CAPACITOR CIRCUIT

OVERVIEW

Aspects of various embodiments are directed to slew control and more particularly to apparatuses and methods of slew control using a switched capacitor circuit.

Driver circuits can be used to generate signal outputs for various different applications and protocols. There are a number of characteristics of driver circuits that can affect the quality of the output signal. For instance, various communication standards specify precise swing levels and slew rates of data signals provided by driver circuits. An upper and lower swing level of a driver circuit defines a range of values at which the driver circuit can generate a signal. The units of this value can depend on the nature of the data signal and include values such as voltage, current, and frequency. For ease of discussion, the swing of a circuit is discussed in terms of voltage unless otherwise specified. The slew rate of a driver circuit refers to the rate of change of output voltage per unit of time and is expressed as volts per second. When the input to the driver circuit is a digital signal with a fast transition, the slew rate for the driver circuit represents the maximum rate of change for the driver circuit. In various instances, the communication standard defines a range of acceptable loads that a driver circuit must be designed to accommodate.

SUMMARY

Various example embodiments are directed to apparatuses and methods for slew control using a switched capacitor circuit. According to various example embodiments, an apparatus includes a swing control circuit, a slew control circuit, and a driver circuit. The swing control circuit is configured and arranged to be powered by an input supply voltage, to receive an input data signal and, in response, to generate a first internal signal having a swing level corresponding to the input supply voltage. The slew control circuit includes a switched capacitor circuit, and is configured and arranged to receive the first internal signal and, in response, to generate a second internal signal using the switched capacitor circuit that is configured to set a slew rate for the second internal signal. The driver circuit is configured and arranged to receive the second internal signal and, in response, to generate an output signal that is based upon the swing level and the slew rate of the second internal signal.

According to embodiments, a method for slew control includes generating, responsive to the swing control circuit receiving an input data signal, a first internal signal having a swing level corresponding to an input supply voltage, wherein the swing control circuit is powered using the input supply voltage. The method further includes generating, responsive to a slew control circuit receiving the first internal signal, a second internal signal using a switched capacitor circuit that is configured to set a slew rate for the second internal signal, wherein the slew control circuit includes the switched capacitor circuit. And, generating, responsive to a driver circuit receiving the second internal signal, an output signal that is based upon the swing level and the slew rate of the second internal signal.

According to embodiments, an apparatus includes a slew control circuit and a driver circuit. The slew control circuit is configured and arranged to receive a first internal signal having a swing level corresponding to an input supply voltage and, in response, to generate a second internal signal. The slew control circuit includes a switched capacitor circuit comprised of a first capacitor and two switches, and a second capacitor. The switched capacitor circuit is configured and arranged to emulate a resistive portion of a resistor capacitor (RC) circuit that sets a slew rate of the second internal signal. The driver circuit is configured and arranged to receive the second internal signal and, in response, to generate an output signal that is based upon the swing level and the slew rate of the second internal signal.

The above discussion/summary is not intended to describe each embodiment or every implementation of the present disclosure. The figures and detailed description that follow also exemplify various embodiments.

DESCRIPTION OF THE DRAWINGS

Various example embodiments may be more completely understood in consideration of the following detailed description in connection with the accompanying drawings, in which.

Figure 1:
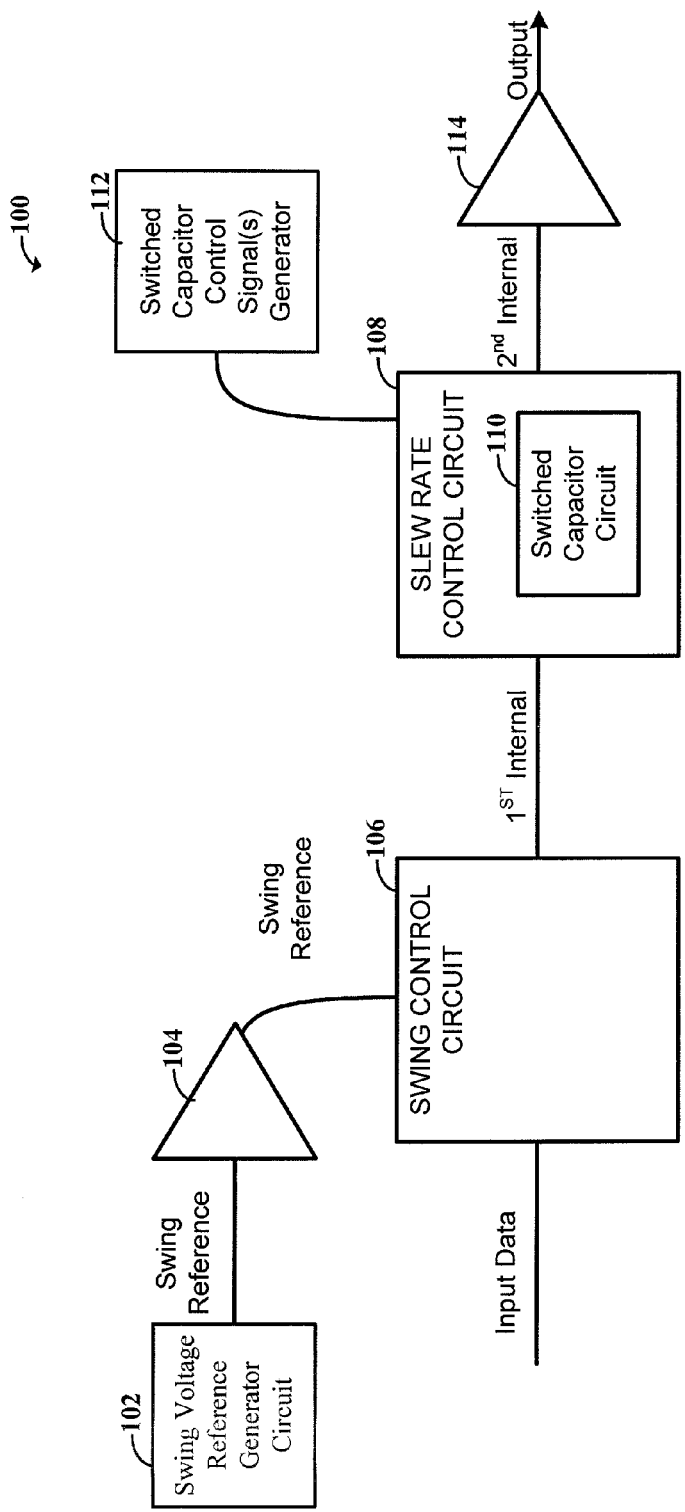
FIG. 1 shows a block diagram of an example of an apparatus for swing and slew control according to various embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving slew control using a slew control circuit comprised of a switched capacitor circuit and generating an internal signal that is based upon a swing level and a slew rate set by the switched capacitor circuit. In certain implementations, aspects of the present disclosure have been shown to be beneficial when used in the context of a communication standard, such as Universal Standard Bus (USB) Power Delivery (PD), that defines a slew rate range and swing of data signals that comply with the standard. In some embodiments of the present disclosure, a switched capacitor circuit is used to emulate a resistive portion of a circuit that sets the slew rate of the internal signal. For example, a resistive portion of a resistor capacitor (RC) circuit can be emulated with a switched capacitor circuit such that a capacitor of the switched capacitor circuit appears as a resistor and a voltage on the respective capacitor is used to charge another capacitor that serves as the capacitive portion of an RC circuit. These and other aspects can be implemented to address challenges, including those discussed in the overview above. While not necessarily so limited, various aspects may be appreciated through a discussion of examples using such exemplary contexts.

Various communication standards, such as USB PD, allow for varying loads while also requiring driver circuits that are configured to provide precise control of slew rate and swing of data signals. For example, communication standards may define a slew rate range and an apparatus is compliant with the communication standard if the slew rate of the apparatus is within the slew rate range. The varying loads can make it difficult to design a driver that is able to control the slew rate for different loads, such that the slew rate is still maintained within the slew rate range defined by the communication standard. In some instances, the voltage (IR) drop relative to the supply lines can be used to control the swing level of a driver circuit. In various instances, the device can be configured to provide a supply voltage at the swing level. It is recognized, however, that these mechanisms can have their share of issues. For instance, setting the swing level by the IR drop can introduce process sensitivity and setting the supply voltage at the swing level can be problematic if the swing level is too low.

In some instances, the slew rate of the apparatus can be controlled by setting an RC time constant for the transmitter. The output signal provided by the driver circuit can be configured to match the RC time constant. However, this solution can be particularly susceptible to process variations in the components that set the RC time constant (e.g., the variation can lead to errors of plus or minus forty percent for a fixed channel load). Capacitor or resistor trimming may be used to bring the variation to a lower level; however, due to the varying load allowed by the communication standards, the slew rate can be difficult to control. In accordance with a number of embodiments, a swing level and slew rate are controlled before the driver circuit. By controlling the swing level and slew rate before the driver circuit, the swing level and slew rate have less sensitivity to varying load conditions.

In various aspects, internal swing control and slew control circuits create an internal signal having the desired swing level and slew rate. The internal signal is then provided to a driver circuit that produces an output signal that has a signal that corresponds to the internal signal. The driver circuit, such as a unity gain driver, then drives an output signal along the communication channel. As discussed herein, the driver circuit can isolate the swing control and slew control circuits from the varying load, which can simplify design considerations for swing and slew control circuits.

The swing level, in accordance with a number of embodiments, can also be set by supplying internal gate logic of the swing control circuit with the desired swing voltage (e.g., the upper voltage level of the swing range). For example, a reference voltage generation circuit (e.g., such as a bandgap circuit) can generate a reference voltage that corresponds to the upper swing voltage level. In various implementations, a buffer circuit (e.g., a low offset buffer) can be used to buffer the reference voltage generation circuit for the swing control circuit.

According to various embodiments of the present disclosure, the slew control circuit can include a switched capacitor circuit that is used to set the slew rate for the internal signal. In various embodiments, the switched capacitor circuit can be used to generate a current that is used to set a rate of charge for one or more capacitors (based upon an effective RC constant of the circuit). The charge rate of the one or more capacitors can thereby be a function of both the capacitor(s) in the switched capacitor circuit and the one or more capacitors being charged by the generated current. In this manner, process variations for the switched capacitor circuit will also be expected to be present in the one or more capacitors being charged, which results in the variations offsetting one another and thereby mitigating slew rate inaccuracy due to process variations. In some embodiments, resistor or capacitor trimming can be reduced or eliminated as compared to circuits that use resistive and capacitive components to set an RC constant and corresponding slew rate. In a number of embodiments, the swing level and slew rate control prior to the driver circuit can be designed to comply with data communications using swing and slew rate control with a data rate of 10 kbps-10 Mbps (e.g., as specified for USB Type-C PD communications), although embodiments in accordance with the present disclosure are not so limited.

In a number of embodiments, a slew control circuit sets the slew rate for an internal signal. The slew control circuit includes a switched capacitor circuit which helps to set the slew rate. The switched capacitor circuit can include at least one capacitor and two switches. For example, the switched capacitor circuit emulates a resistance for an RC circuit that is used to set the slew rate of the internal signal. In various embodiments, the switched capacitor circuit responds to a first internal signal having a swing level corresponding to a reference swing voltage by charging and discharging a capacitor that is a part of the switched capacitor circuit. The charging and discharging is to a voltage of the first internal signal, which can be maintained within the respective voltages that correspond to the swing level by the swing control circuit. As discussed herein, the slew rate of the signal output by the slew control circuit can be set based on a ratio of values of two capacitors in the slew control circuit and a switching frequency of the two switches of the switched capacitor circuit.

In some embodiments, the switched capacitor circuit is used to generate a reference current having a value that is set based upon an equivalent resistance provided by the switched capacitor circuit. The reference current can be used to control the current provided at the output of an internal driver (amplifier) circuit. The output of the internal driver circuit can be used to charge a capacitor. The rate of charge can then be used to set the slew rate for the output driver.

Turning now to the figures, FIG. 1 shows a block diagram of an example of an apparatus according to various embodiments of the present disclosure. As illustrated by FIG. 1, in various embodiments, the apparatus 100 includes a transmitter that provides swing and slew rate control for an output signal. In various embodiments, the transmitter can be configured to operate in compliance with requirements of one or more communication protocols, such as USB PD protocols. The apparatus, in a number of embodiments, includes a swing control circuit 106, a slew rate control circuit 108, and a driver circuit 114. The apparatus 100 controls and/or sets the swing level and the slew rate and outputs a buffered signal to the communication channel using the driver circuit 114, as described further herein.

According to embodiments, the swing control circuit 106 can be configured to produce a first internal signal that is responsive to input data and that has a desired swing peak-to-peak value. In various implementations, the particular swing peak-to-peak value can be set based upon input reference voltages provided to the swing control circuit 106.

For instance, a swing reference voltage can be generated by a reference generator circuit 102 and provided (e.g., using a buffer circuit 104) to the swing control circuit 106. In some embodiments, this swing reference voltage is set relative to ground, in which case a separate swing reference voltage generator is not used. Various embodiments allow for the use of a second swing reference voltage generator to set the opposing voltage that defines the swing.

In various embodiments, the swing control circuit 106 can include a buffer (or amplifier) circuit that is powered by an input supply voltage. The input supply voltage can be set to the same value (or near) the swing level. In response to a corresponding input data signal, the buffer circuit can drive the first internal signal to a value that is at (or very near) the supply voltage. As such, the supply voltage can be used to set the upper voltage for the swing of the swing control circuit 106 and the first internal signal.

It is recognized that the supply voltage produced by voltage supply circuits can vary due to process variation or other factors. Generating a separate reference voltage, in various embodiments, can be particularly useful for mitigating swing voltage variation due to such factors. In some embodiments, the apparatus 100 includes a swing voltage reference generator circuit 102 and a swing buffer circuit 104. The swing reference circuit can be implemented using various voltage generation techniques (e.g., a bandgap voltage reference circuit). The swing buffer circuit 104 can be used to provide isolation for the swing voltage reference generator circuit 102 while providing the input supply voltage to the swing reference circuit 102.

The slew rate control circuit 108, as illustrated by FIG. 1, includes a switched capacitor circuit 110. In response to receiving the first internal signal, the slew rate control circuit 108 generates a second internal signal using the switched capacitor circuit 110. As discussed herein, the switched capacitor circuit 110 can be used to define a reference current that is used to set the slew rate for the second internal signal. For instance, the switched capacitor circuit 110 can be configured to provide a desired equivalent resistance at a corresponding frequency of operation. The equivalent resistance can be used to generate a reference current that is used to charge a separate capacitor. The charge rate of the capacitor can be used to set the slew rate of the second internal signal.

In various embodiments, the switched capacitor circuit 110 can include a capacitor and two switches that are used to control the charge and discharge of the capacitor. A switched capacitor control signal(s) generator circuit 112 can be configured to generate control signals for the switches. The effective resistance of the switched capacitor circuit is a function of the capacitance and the frequency of the switching. Accordingly, the switching frequency of the control signals generated by the switched capacitor control signal generator 112 can be used to adjust the effective resistance of the switched capacitor circuit, and thereby, to adjust the slew rate of the second internal signal.

In response to receiving the second internal signal, the driver circuit 114 can be configured to generate an output signal that is based upon the swing level and the slew rate of the second internal signal. The output signal is communicated out to the communication channel by the driver circuit 114. The driver circuit 114 can be configured with sufficient drive strength and supply voltage level to keep the shape and swing level of the second internal signal under various loading conditions specified by the communication protocol.

The slew rate of the apparatus (e.g., the maximum rate of change of output voltage per unit of time) is controlled by the second internal signal. In other words, the output of the driver circuit 114 will have an upper bound that is limited by the second internal signal. As such, the capabilities for the driver circuit 114 need not be restricted by the upper limits of the communication protocol. For instance, the driver circuit 114 can be configured to, in the worst case conditions, have the capability of driving the output signal at a slew rate that is faster than the protocol's minimum slew rate and with a swing that is greater than the protocol's minimum swing; however, the maximum slew rate and swing can exceed those of the communication protocol because they will be bound by the corresponding slew rate and swing of the second internal signal. Thus, the design constraints for the driver circuit 114 can be relaxed.

The various embodiments described herein may be combined in certain embodiments, and various aspects of individual embodiments may be implemented as separate embodiments. For instance, aspects of FIGS. 2, 3A, and/or 3B can be part of the apparatus described in FIG. 1. For example, the circuitry illustrated by FIG. 1 can be used with a variety of different types of devices. In some instances, various other techniques and/or features can be used in apparatus embodiments to improve device behavior. Further, in accordance with various embodiments, an apparatus can include fewer features and/or additional components than illustrated by FIG. 1. For example, an apparatus embodiment can include a current mirror circuit to generate a mirrored version of a reference current generated by the switched capacitor circuit 110 and used to charge a capacitor (e.g., the second capacitor).

Figure 2:
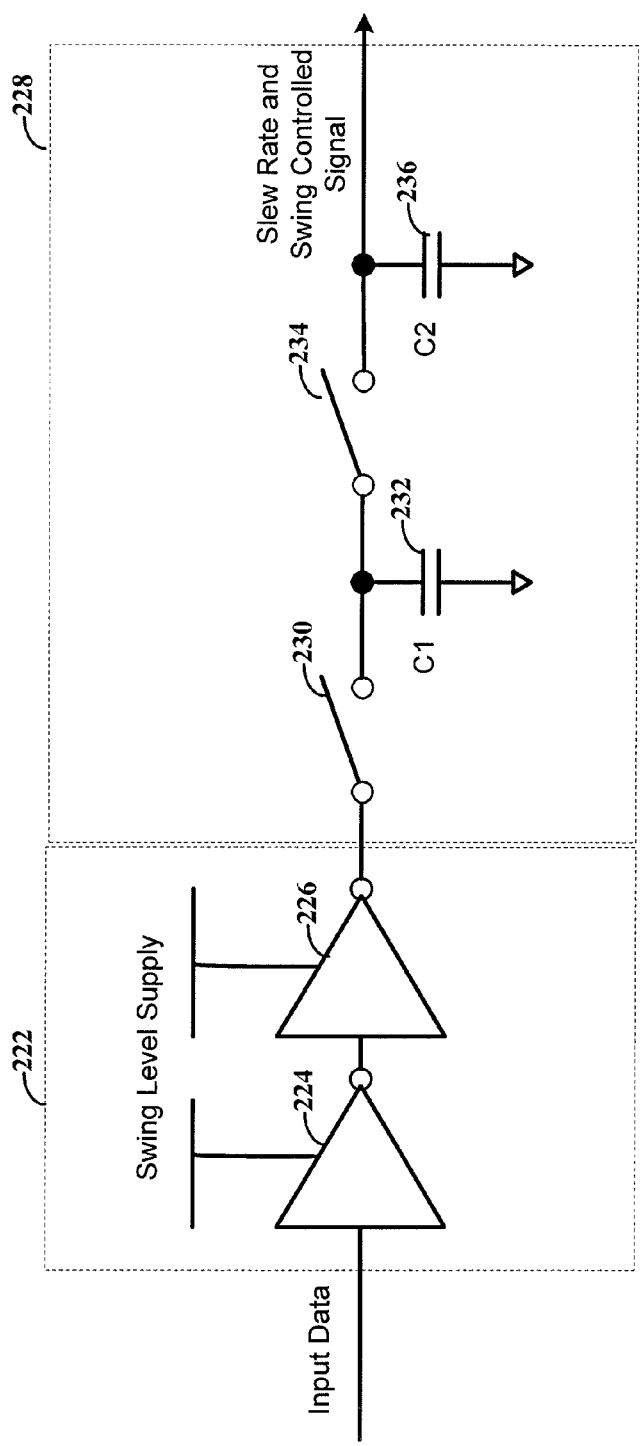
FIG. 2 shows a block diagram of an example of a swing control circuit and a slew control circuit according to various embodiments of the present disclosure.

FIG. 2 shows a block diagram of an example of a swing control circuit and a slew control circuit according to various embodiments of the present disclosure. In various embodiments, the swing control circuit 106 and the slew control circuit 108 illustrated by FIG. 1 can correspond to the swing control circuit 222 and the slew control circuit 228 illustrated by FIG. 2.

In a number of embodiments, the swing control circuit 222 is powered by an input supply voltage. The input supply voltage, as previously discussed, can be a buffered version of a reference swing voltage. That is, the input supply voltage is internally regulated by the apparatus to correspond to the desired swing voltage. As illustrated by FIG. 2, internal gate logic circuitry of the swing control circuit 222 (e.g., buffer/amplifiers 224 and 226) are supplied with the input supply voltage. The supply voltage provides the upper limit to the output voltage of buffer circuits 224 and 226. Thus, in response to receiving an input data signal, the swing control circuit generates a first output signal having a swing level corresponding to the input supply voltage.

The slew control circuit 228 receives the first internal signal and generates a second internal signal having a desired slew rate. In a number of embodiments, the slew control circuit 228 includes a first capacitor 232, a second capacitor 236, and two switches 230, 234. The capacitors are each depicted as a single element, however, it is understood that multiple capacitors can be used in combination to provide the desired capacitive value for each individual capacitor element depicted in the circuit illustrated by FIG. 2. The first capacitor 232 and the two switches 230, 234 form a switched capacitor circuit in which the charge on the first capacitor 232 is controlled using the switches 230 and 234.

In various embodiments, the switched capacitor circuit functions as an RC circuit with an RC time constant that is used to set the slew rate of the second internal signal. The resistive portion of the RC circuit can be emulated by the switched capacitor circuit such that the switched capacitor circuit appears as a resistor and the capacitive portion of the RC circuit corresponds to the second capacitor 236.

When the switch 230 is closed, the capacitor 232 is charged/discharged relative to the voltage of the first internal signal as provided by the swing control circuit 222. When switch 234 is closed, charge is transferred between capacitors 232 and 236. The amount of charge that is transferred per unit of time is a function of the capacitive value and the switching frequency of the switches 230 and 234. The resulting charge transfer is equivalent to a current. Accordingly, the voltage on capacitor 236 is set based upon the equivalence of an RC time constant that corresponds to the effective resistance of the switched capacitor circuit.

As discussed herein, the slew rate can be based on a ratio between a value of the first capacitor 232 and a value of the second capacitor 236, and upon a switching frequency of the two switches 230, 234. As previously discussed, the switching frequency of the two switches 230, 234 is set and/or based on switched capacitor control signals. The equivalent resistance (Req) of the switched capacitor circuit can be expressed as:

$$\frac{1}{fC1}$$

Wherein f is the switching frequency of the two switches 230, 234 and C1 is the value of the first capacitor 232. The slew rate of the second internal signal can be proportional to 1/ReqC2, wherein C2 is the value of the second capacitor 236 and can be expressed as:

$$\frac{fC1}{C2}$$

Thereby, the slew rate is set by the ratios of the first capacitor 232 and the second capacitor 236 and the switching frequency. Accordingly, the slew rate is proportional to a ratio of the value of the first capacitor 232 and a value of the second capacitor 234. Due to this relationship between the capacitances, process variations that are common between the two capacitors will tend to cancel each other out, which can help to mitigate variations in the slew rate due to such process variations.

According to various embodiments, the switching frequency can be used to trim the effective resistance and corresponding slew rate, which can improve the accuracy of the transmitter. For instance, the slew rate can vary from one device to another due to a difference in mismatches between the first capacitor 232 and the second capacitor 236. For example, the mismatches may be due to process variations that are not common between the two capacitors. Without being limited by theory, such a mismatch is often smaller than variations caused by the process variation of the absolute values in a manner that is common for both of the first and second capacitors 232, 236. Furthermore, in accordance with some embodiments, internally controlling the slew rate and swing level can mitigate a need for additional resistor or capacitor trimming, which can both help reduce the amount of silicon area, and result in reduced design complexity. It is recognized that communication circuits can often be designed to generate internal signals that have relatively high accuracy in their frequencies. Leveraging off of these circuits, the switching frequency can be accurately generated, which can reduce the need for frequency trimming relative to devices with a wide variance in frequencies across different devices.

Figure 3:
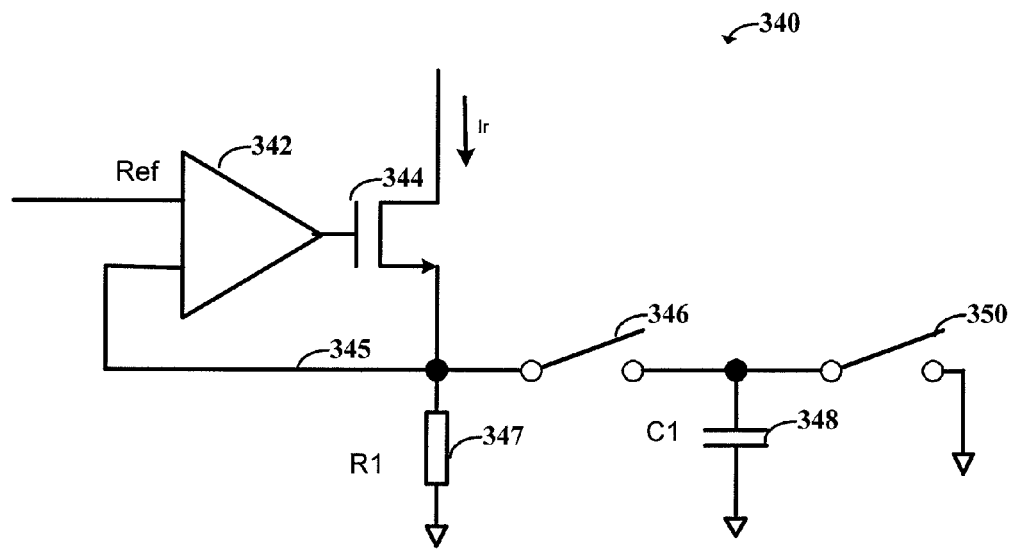
FIG. 3 shows a block diagram of an example of a circuit generating a reference current according to various embodiments of the present disclosure.

FIG. 3 shows a block diagram of an example of a circuit generating a reference current according to various embodiments of the present disclosure. The circuit 340 of FIG. 3 can be part of a slew control circuit, such as the slew control circuit 108 illustrated by FIG. 1. The switched capacitor circuit can include a first capacitor 348 and two switches 346, 350.

In accordance with various embodiments, the switched capacitor circuit generates a reference current Ir. The reference current generated by the switched capacitor circuit is set as a function of an equivalent resistance that is provided by the switched capacitor circuit and a reference voltage (Ref), as discussed herein. The reference current Ir, in some embodiments, can be used to control the rate of charge for another capacitor (e.g., the second capacitor 468 illustrated in FIG. 4). The rate at which the second capacitor is charged can be used to set the slew rate.

The slew rate control circuit, in accordance with various embodiments, includes an amplifier circuit 342, a transistor 344 (e.g., a field effect transistor (FET)), and a resistor 347. The amplifier circuit 342 adjusts the reference current Ir by changing the gate voltage provided to the transistor 344. The resulting change in current through the transistor 344 causes a corresponding change in the voltage at node 345. In particular, the voltage at node 345 is equal to the equivalent resistance of the switched capacitor circuit (which includes capacitor 348) multiplied by the reference current Ir. In some embodiments, a resistor 347 can optionally be included to provide a direct current bias for the circuit. In particular implementations, the resistor 347 can have a large resistance value, relative to the effective resistance of the switched capacitor circuit, so as to have only a small effect on the reference current Ir.

According to embodiments of the present disclosure, the amplifier circuit 342 can be configured to adjust the reference current Ir until the voltage of node 345 is equal to the reference voltage (Ref). For example, a higher equivalent resistance (Req) of the switched capacitor circuit results in a corresponding decrease in the reference current. Conversely, a lower equivalent resistance of the switched capacitor circuit results in an increase in the reference current.

In various embodiments, the switched capacitor circuit sets the slew rate for the internal signal based on an equivalent resistance (Req) of the switched capacitor circuit. The reference current (Ir) generated by the switched capacitor circuit and which is based on the Req can be expressed as:

$$Ir = \frac{Vref}{Req} = fC1Vref$$

Wherein f is the switching frequency of the two switches 346, 350 and C1 is the value of the first capacitor 348. The slew rate of the second internal signal can be proportional to 1/ReqC2, wherein C2 is the value of the second capacitor 468 and can be expressed as:

$$\frac{Ir}{C2} = \frac{Vref fC1}{C2}$$

Thereby, the slew rate is set by the ratios of the first capacitor 348 and the second capacitor 468 and the switching frequency. Said differently, the slew rate is based upon the ratio of the sum of the reference voltage, a switching frequency of the two switches, and a value of the first capacitor 348 and a value of the second capacitor 468. The switching frequency is optionally trimmed and can result in an accurate and/or more accurate transmitter.

Figure 4:
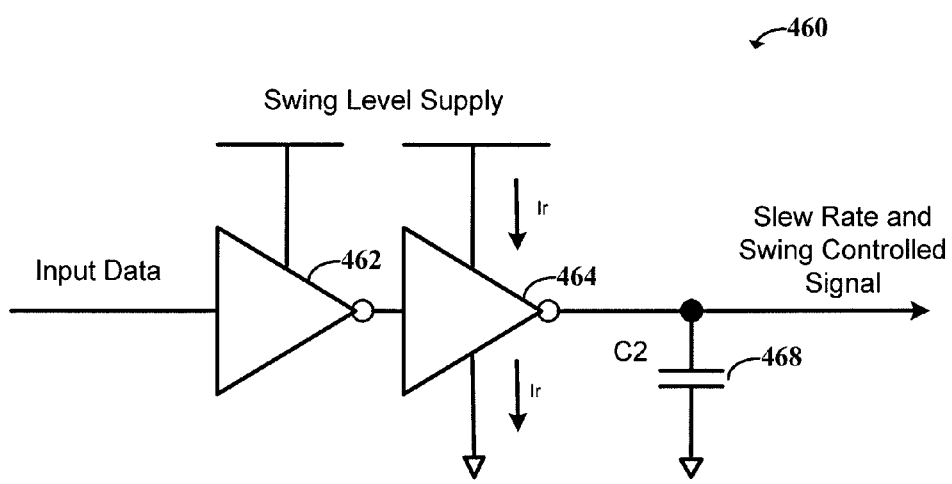
FIG. 4 shows a block diagram of an example of a circuit charging a capacitor using the reference current according to various embodiments of the present disclosure.

FIG. 4 shows a block diagram of an example of a circuit 460 charging a capacitor using the reference current according to various embodiments of the present disclosure. As previously discussed, the swing control circuit can be powered by an input supply voltage. As illustrated by FIG. 4, internal gate logic of the swing control circuit (e.g., buffer/amplifiers 462 and 464) are supplied with the input supply voltage. In response to receiving an input data signal, the swing control circuit generates a first output signal having a swing level corresponding to the input supply voltage.

The slew control circuit receives the first internal signal and generates a second internal signal having a desired slew rate. As discussed herein, the slew rate can be set based upon a reference current Ir that is set using a switched capacitor circuit, e.g., as discussed in connection with FIG. 3. In a number of embodiments, a current mirror circuit can be used to generate a mirrored version of the reference current generated by the switched capacitor circuit. The mirrored version of the reference current can then be provided to the buffer circuit 464 to provide an upper limit to the output current of the buffer circuit, which limits the charge rate of the second capacitor 468. In some specific embodiments, the mirrored reference current is used to drive the pull-up and pull-down currents of the buffer circuit 464 of the swing control circuit (e.g., amplifier circuit) and the corresponding pull-up and pull-down circuits can be tied to voltages corresponding to the desired swing voltage range. Thereby, the capacitor is charged using voltages that correspond to the swing level (e.g., the first internal signal) and that are provided by driving pull-ups and pull-downs of a buffer/amplifier circuit 464 of the swing control circuit using the mirrored reference current.

As previously discussed, the slew rate of the apparatus (e.g., the rate of change of output voltage per unit of time) is controlled by the second internal signal. For example, the switched capacitor circuit is used to set the slew rate for the second internal signal. The slew rate is set by the reference current, which is set by the equivalent resistance provided by the switched capacitor circuit.

Figure 5:
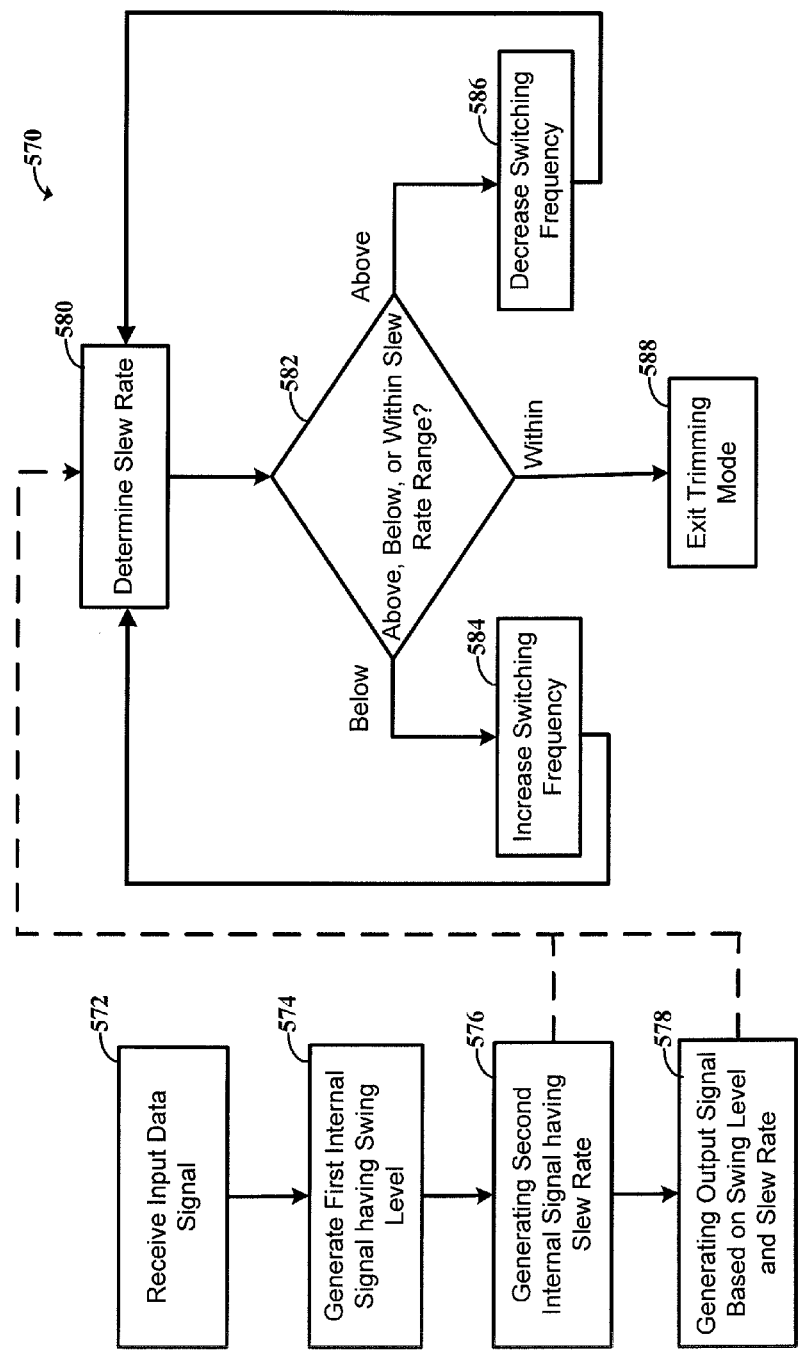
FIG. 5 shows a flow diagram of an example method of swing and slew control according to various embodiments of the present disclosure.

Various embodiments include methods of using the apparatuses and circuitry as described above. FIG. 5 shows a flow diagram of an example method of slew and swing control according to various embodiments of the present disclosure. As illustrated, at block 572, the method 570 includes a swing control circuit receiving an input data signal, and at block 574, generating, responsive to the swing control circuit receiving the input data signal, a first internal signal having a swing level corresponding to an input supply voltage. The input supply voltage, as previously discussed, powers the swing control circuit.

At block 576, the method 570 includes generating, responsive to a slew control circuit receiving the first internal signal, a second internal signal using a switched capacitor circuit that is configured to set a slew rate for the second internal signal. The slew control circuit can include the switched capacitor circuit. The method 570 also includes, at block 578, generating, responsive to a driver circuit receiving the second internal signal, an output signal that is based upon the swing level and the slew rate of the second internal signal.

In accordance with various embodiments, the slew rate is set based on an equivalent resistance of the switched capacitor circuit. In some embodiments, the method 570 includes using the switched capacitor circuit to set the resistance of an RC circuit that is used to define the slew rate. For example, a first capacitor that emulates a resistive portion of the RC circuit is charged and discharged using the switched capacitor circuit and responsive to the first internal signal. The charging and discharging is thereby to respective voltages that correspond to the swing level. A second capacitor is charged using a voltage on the first capacitor.

In other embodiments, a reference current is generated based on the equivalent resistance of the switched capacitor circuit and the reference current is used to set the slew rate. For example, using the switched capacitor circuit, a reference current that is set by an equivalent resistance provided by the switched capacitor circuit is generated. A mirrored version of the reference current is generated and used to charge a capacitor. The capacitor is charged using voltages that correspond to the swing level and that are provided by driving pull-ups and pull-downs of a driver circuit of the swing control circuit using the mirrored reference current to provide the voltages.

In accordance with various embodiments, the method 570 includes a trimming mode. The trimming mode, as used herein, includes monitoring (e.g., checking and/or adjusting) the slew rate of the apparatus to ensure compliance with the slew rate range of a communication protocol. The trimming mode can be implemented, for example, during a calibration of the apparatus and/or in response to an indication that the apparatus is changing to a different communication protocol that might also have a different requirement on the slew rate. For example, some transceivers and/or driver circuits can be configured to operate using a plurality of different communication protocols.

As previously discussed, the slew rate of the apparatus is controlled by the second internal signal. The slew rate is based on a ratio of values of the two capacitors in the slew control circuit and a switching frequency of the two switches of the switched capacitor circuit. Accordingly and in certain embodiments, the switching frequency of the two switches can be used to adjust the effective resistance of the switched capacitor circuit, and thereby, to adjust the slew rate of the second internal signal. The trimming mode, in various embodiments, includes determining the slew rate of a signal (e.g., measuring the slew rate) at a particular switching frequency and adjusting the switching frequency in response to the slew rate being outside a desired slew rate range (e.g., as may be determined based upon the communication protocol). The particular switching frequency, in some embodiments, is an initial frequency that can be set a number of different ways. For example, the initial frequency can be a random frequency and/or can be based on knowledge, such as the expected ratio of the capacitors and the targeted slew rate of the apparatus. The trimming mode can also be used to account for process variations so as to improve the accuracy of each device. For instance, the actual ratio of the values of the capacitors can vary from the intended ratio, in various embodiments, due to manufacturing differences, temperature variations, and/or other reasons.

For example, as illustrated by FIG. 5, the trimming mode can include, at block 580, determining a slew rate of the apparatus using the output signal (e.g., at block 578) or the second internal signal (e.g., at block 576 and/or the second internal signal as input to the driver circuit). The output signal, for instance, has a corresponding slew rate that is based on the slew rate of the apparatus as controlled by the second internal signal. The second internal signal controls a slew rate of the apparatus (e.g., the upper bound of the slew rate of the apparatus). In various embodiments, the output signal may be used rather than the second internal signal to prevent and/or mitigate the mismatch between the second internal signal and the output signal, which may be subject to circuit non-idealities.

At block 582, using the output signal or the second internal signal, the method 570 includes determining if the slew rate of the signal is above, below, or within the desired slew rate range. In various embodiments, the method 570 includes adjusting a switching frequency of the two switches of the switched capacitor circuit in response to the output signal or the second internal signal having a slew rate that is outside a slew rate range of a communication protocol. For example, in response to determining the output signal and/or second internal signal have a slew rate and/or are associated with a slew rate range that is below a lower bound of the desired slew rate range, the switching frequency of the two switches of the switched capacitor circuit can be increased to increase the slew rate of the apparatus, per block 584. In response to determining the output signal and/or second internal signal have a slew rate and/or are associated with a slew rate range that is above an upper bound of the slew rate range of the communication protocol, the switching frequency of the two switches of the switched capacitor circuit can be decreased to decrease the slew rate of the apparatus, per block 586. The trimming mode can continue for subsequent transitions of the output signal until the output signal and/or second internal signal is determined to have a slew rate that is within the desired slew rate range. The trimming mode can then be exited, per block 588.

According to various embodiments, the trimming mode can include an iterative and/or repeated process. For example, the slew rate can be periodically and/or continuously measured and the switching frequency can be adjusted until the apparatus complies with the particular communication protocol and to tune the slew rate of the apparatus. The continual monitoring can be useful for compensating for environmental changes (e.g., due to temperature).

Various blocks, modules or other circuits may be implemented to carry out one or more of the operations and activities described herein and/or shown in the figures. In these contexts, a "block" (also sometimes "circuit", "logic circuitry", or "module") can be implemented using a circuit that carries out one or more of these or related operations/activities. In various embodiments, a hard-wired control block can be used to minimize the area for such an implementation in case a limited flexibility is sufficient. Alternatively and/or in addition, in certain of the above-discussed embodiments, one or more modules are discreet logic circuits or programmable logic circuits configured and arranged for implementing these operations/activities.

Based upon the above discussion and illustrations, those skilled in the art will readily recognize that various modifications and changes may be made to the various embodiments without strictly following the exemplary embodiments and applications illustrated and described herein. For example, an apparatus can include different types of circuitry and configurations than illustrated by FIGS. 1 and 2. Such modifications do not depart from the true spirit and scope of various aspects of the invention, including aspects set forth in the claims.

What is claimed is:

1. An apparatus comprising:
   a swing control circuit configured and arranged to be powered by an input supply voltage, to receive an input data signal and, in response, to generate a first internal signal having a swing level corresponding to the input supply voltage;
   a slew control circuit, including a switched capacitor circuit, configured and arranged to receive the first internal signal and, in response, to generate a second internal signal using the switched capacitor circuit to set a slew rate for the second internal signal; and
   a driver circuit configured and arranged to receive the second internal signal and, in response, to generate an output signal that is based upon the swing level and the slew rate of the second internal signal.

2. The apparatus of claim 1, wherein the switched capacitor circuit is configured to emulate a resistance of a resistor capacitor (RC) circuit that sets the slew rate of the second internal signal.

3. The apparatus of claim 2, wherein the switched capacitor circuit is configured to respond to the first internal signal by charging and discharging a capacitor that is part of the RC circuit.

4. The apparatus of claim 3, wherein the charging and discharging are to respective voltages that correspond to the swing level.

5. The apparatus of claim 1, wherein the switched capacitor circuit is configured to generate a reference current that is set by an equivalent resistance provided by the switched capacitor circuit.

6. The apparatus of claim 5, further including a current mirror circuit that is configured to generate a mirrored version of the reference current and wherein the slew control circuit is configured to charge a capacitor using the mirrored version of the reference current.

7. The apparatus of claim 1, wherein the slew control circuit includes a first capacitor and a second capacitor and two switches.

8. The apparatus of claim 7, wherein the slew control circuit is configured and arranged to generate the second internal signal using the switched capacitor circuit that is configured to set the slew rate for the second internal signal based on a value of the first and second capacitors and a switching frequency of the two switches.

9. The apparatus of claim 7, wherein the switched capacitor circuit is configured to set the slew rate for the second internal signal based upon a switching frequency of the two switches and a ratio between a value of the first capacitor; and a value of the second capacitor.

10. The apparatus of claim 7, wherein the switched capacitor circuit is configured to set the slew rate for the second internal signal based upon a reference voltage, a switching frequency of the two switches, and a ratio between a value of the first capacitor; and a value of the second capacitor.

11. A method comprising:
    generating, responsive to a swing control circuit receiving an input data signal, a first internal signal having a swing level corresponding to an input supply voltage, wherein the swing control circuit is powered using the input supply voltage;
    generating, responsive to a slew control circuit receiving the first internal signal, a second internal signal using a switched capacitor circuit to set a slew rate for the second internal signal, wherein the slew control circuit includes the switched capacitor circuit; and generating, responsive to a driver circuit receiving the second internal signal, an output signal that is based upon the swing level and the slew rate of the second internal signal.

12. The method of claim 11, further including adjusting a switching frequency of two switches of the switched capacitor circuit in response to the output signal having a slew rate that is outside a slew rate range of a communication protocol.

13. The method of claim 12, wherein adjusting the switching frequency of the two switches includes:
increasing the switching frequency in response to the slew rate being less than a lower bound of the slew rate range of the communication protocol; and
decreasing the switching frequency in response to the slew rate being greater than an upper bound of the slew rate range of the communication protocol.

14. The method of claim 11, wherein the slew control circuit includes a first and a second capacitor and two switches, wherein the method further includes setting the slew rate for the second internal signal based on a switching frequency of the two switches and a value of the first capacitor and a value of the second capacitor.

15. The method of claim 11, further including emulating a resistor capacitor (RC) circuit that sets the slew rate of the second internal signal using the switched capacitor circuit by:
charging and discharging, responsive to the first internal signal, a first capacitor that emulates a resistive portion of the RC circuit using the switched capacitor circuit, wherein the charging and discharging are to respective voltages that correspond to the swing level; and
charging a second capacitor that is configured to provide a capacitive portion of the RC circuit using a voltage on the first capacitor.

16. The method of claim 11, further including:
generating, using the switched capacitor circuit, a reference current that is set by an equivalent resistance provided by the switched capacitor circuit;
generating a mirrored version of the reference current; and
charging a capacitor using the mirrored version of the reference current.

17. An apparatus comprising:
a slew control circuit configured and arranged to receive a first internal signal having a swing level corresponding to an input supply voltage and, in response, to generate a second internal signal, the slew control circuit including:
a switched capacitor circuit comprised of a first capacitor and two switches, the switched capacitor circuit configured and arranged to emulate a resistive portion of a resistor capacitor (RC) circuit that sets a slew rate of the second internal signal; and
a second capacitor; and
a driver circuit configured and arranged to receive the second internal signal and, in response, to generate an output signal that is based upon the swing level and the slew rate of the second internal signal.

18. The apparatus of claim 17, wherein the switched capacitor circuit is configured and arranged to charge and discharge the first capacitor responsive to the first internal signal, wherein the charge and discharge is to respective voltages that correspond to the swing level.

19. The apparatus of claim 17, further including:
a switched capacitor control signal generation circuit configured and arranged to generate control signals for the switches of the switched capacitor circuit and provide the control signals to the switched capacitor circuit, wherein the control signals set a switching frequency of the two switches, and
wherein the switched capacitor circuit is configured and arranged to set the slew rate for the second internal signal based upon of the switching frequency of the two switches and a ratio of a value of the first capacitor; and a value of the second capacitor.

20. The apparatus of claim 17, further including:
a swing voltage reference generator circuit configured and arranged to generate a swing reference signal;
a buffer circuit configured and arranged to generate the input supply voltage by buffering the swing reference signal; and
a swing control circuit configured and arranged to be powered by the input supply voltage, to receive an input data signal and, in response, to generate the first internal signal having a swing level corresponding to the input supply voltage.

\* \* \* \* \*